United States Patent
Duan et al.

(10) Patent No.: US 7,941,781 B1
(45) Date of Patent: *May 10, 2011

(54) ON-CHIP TEST CIRCUIT AND METHOD FOR TESTING OF SYSTEM-ON-CHIP (SOC) INTEGRATED CIRCUITS

(75) Inventors: Haoran Duan, Denver, CO (US);
Charles Evans, Denver, CO (US);
Michael A. Rencher, Denver, CO (US);
James R. Emmert, Denver, CO (US)

(73) Assignee: Marvell International Technology Ltd., Hamilton (BM)

( * ) Notice: Subject to any disclaimer, the term of this patent is extended or adjusted under 35 U.S.C. 154(b) by 165 days.

This patent is subject to a terminal disclaimer.

(21) Appl. No.: 12/350,802

(22) Filed: Jan. 8, 2009

Related U.S. Application Data

(63) Continuation of application No. 11/377,108, filed on Mar. 15, 2006, now Pat. No. 7,484,188.

(51) Int. Cl.
*G06F 17/50* (2006.01)

(52) U.S. Cl. ........................ 716/136; 716/138

(58) Field of Classification Search .............. 716/4–6, 716/136–138
See application file for complete search history.

(56) References Cited

U.S. PATENT DOCUMENTS

| | | |
|---|---|---|
| 6,694,489 B1 | 2/2004 | Case et al. |
| 7,124,376 B2 | 10/2006 | Zaidi et al. |
| 7,185,295 B2 | 2/2007 | Park et al. |
| 7,484,188 B2 * | 1/2009 | Duan et al. .................. 716/4 |
| 2004/0216080 A1 | 10/2004 | Roesner et al. |

* cited by examiner

*Primary Examiner* — Jack Chiang
*Assistant Examiner* — Binh C Tat

(57) ABSTRACT

A system and method of testing IP cores contained in a system-on-chip integrated circuit is disclosed. An operation command is received on an input/output port of the circuit. The operation command includes an operation code component, data component(s), and expected time component. The received operation command is processed to supply test data to each of the IP cores being tested. Result data is received in response to the supplied test data from each of the IP cores being tested. The result data is processed and from the processed result data is generated a status data packet. The status data packet includes the operation code component and a status flag component and is provided on the input/output port.

18 Claims, 4 Drawing Sheets

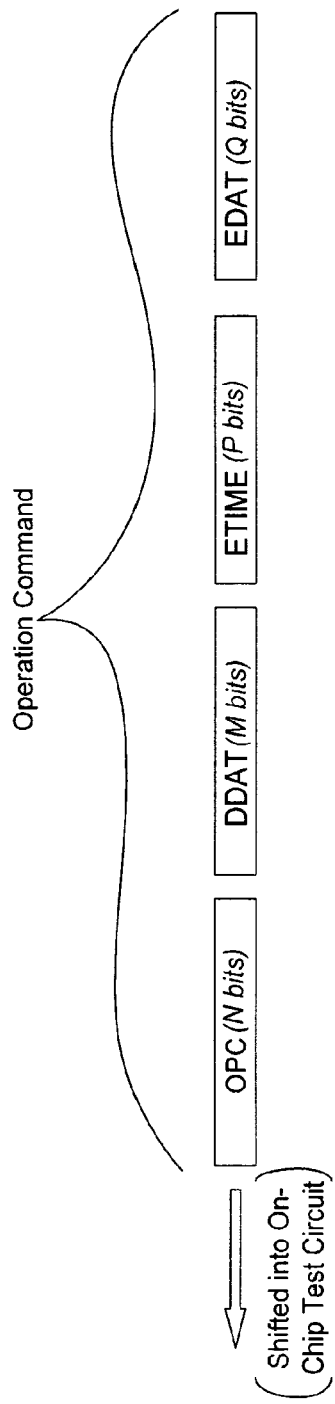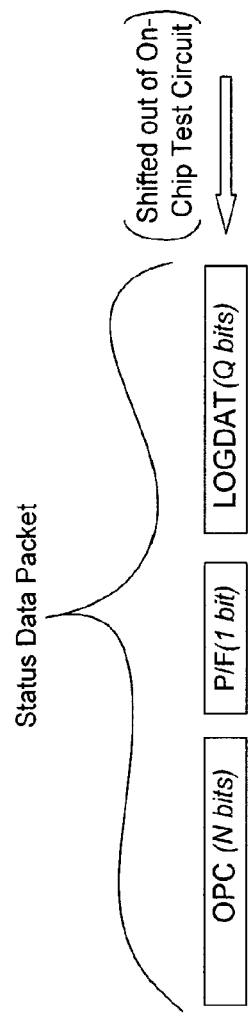
Figure 2A
Figure 2B

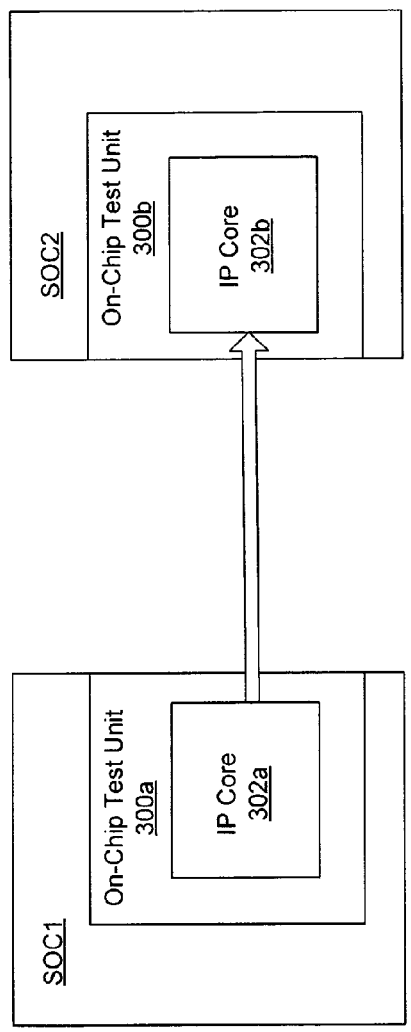
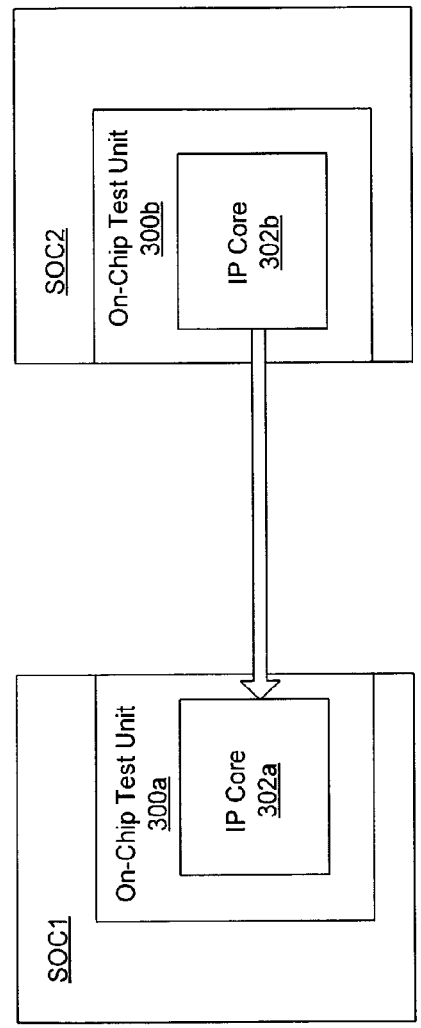
Figure 3A
Figure 3B

ON-CHIP TEST CIRCUIT AND METHOD FOR TESTING OF SYSTEM-ON-CHIP (SOC) INTEGRATED CIRCUITS

CROSS-REFERENCES TO RELATED APPLICATIONS

This present application is a continuation of U.S. patent application Ser. No. 11/377,108 filed Mar. 15, 2006 titled, "ON-CHIP TEST CIRCUIT AND METHOD FOR TESTING OF SYSTEM-ON-CHIP (SOC) INTEGRATED CIRCUITS." The specification of said application is hereby incorporated in its entirety, except for those sections, if any, that are inconsistent with this specification.

BACKGROUND OF THE INVENTION

A system-on-chip (SOC) integrated circuit is a single chip or integrated circuit that includes all the necessary electronic circuitry to form a complete system. For example, an SOC integrated circuit may include on-chip memory such as random access memory (RAM), a microprocessor, a digital signal processor (DSP), a universal serial bus (USB) port, other peripheral interfaces, and other components to a complete computer system within a single integrated circuit. Such SOC integrated circuits are utilized in a variety of devices, such as digital cameras, cellular phones, and personal digital assistants (PDAs).

In an SOC integrated circuit, each of the various functional circuit blocks, such as the microprocessor and memory in the computer system example above, may be referred to as an intellectual property (IP) core. An IP core is thus a block of logic that provides required functionality and is commonly utilized in multiple integrated circuits through a process that is known as "reuse." Thus, through reuse the same IP core may be utilized in a first SOC integrated circuit and in a different second SOC integrated circuit. Because the specific designs of the first and second SOC integrated circuits are different, and also due to the variation of semiconductor manufacturing processes for each, the IP core, as well as the other circuitry in the integrated circuit the core is embedded within, must be tested for each integrated circuit to ensure its proper operation. For example, where the IP core being tested corresponds to circuitry that implements the universal serial bus (USB) protocol, the IP core must be independently tested for each SOC integrated circuit due to the different components and layouts from one SOC integrated circuit to the next.

The IP core can be very complex, consisting of closely coupled complex analog and digital components, and consisting of multiple levels of design hierarchies. For example, the IP cores that implement high speed wired or wireless communication protocols such as USB, PC1 Express, wireless LAN, etc., typically are complex sub-systems just by themselves. Testing of this kind of IP core in a SOC integrated circuit is an expensive and difficult task. Traditional scan and BIST methods can not provide satisfactory coverage and flexibility. One prior approach for testing this kind of complex IP core in an SOC integrated circuit is to provide multiplexers for routing all required signals to and from each IP core within the integrated circuit through external pins of the SOC integrated circuit. In this way, an automated tester coupled to the SOC integrated circuit could transfer all required signals to and from each IP core to properly test that core. Such an approach is not always practical for a variety of reasons. For example, in some instances a given IP core may have more signals than there are external pins of the SOC integrated circuit. In this situation multiplexing all the required signals for the IP core through the external pins of the integrated circuit may prohibitively complicate or increase the cost of testing such an IP core. Where the SOC integrates multiple complex mixed-signal IP instances, reliable and cost effective testing will also require prohibitively complex and expensive automated testers.

There is a need for comprehensively and efficiently testing complex IP cores in SOC integrated circuits.

SUMMARY OF THE INVENTION

According to one aspect of the present invention, a method of testing IP cores contained in a system-on-chip integrated circuit having an input/output port includes receiving an operation command on the input/output port. The operation command includes an operation code component, data components, and an expected time component. The received operation command is processed to supply test data to each of the IP cores being tested. Result data is received in response to the supplied test data from each of the IP cores being tested. The result data is processed and from the processed result data is generated a status data packet. The status data packet includes the operation code component and a status flag component and is provided on the input/output port. According to another aspect, an on-chip test circuit for testing a system-on-chip integrated circuit includes a programming control unit having an input/output port adapted to receive an operation command, an execution and reporting unit coupled to programming control unit and an interface unit coupled to the execution and reporting unit and to an IP core or cores being tested.

FIG. 2A illustrates the format of an operation command applied to an input/output port of the on-chip test unit of FIG. 1 according to an embodiment of the present invention.

FIG. 2B illustrates the format of a status data packet output from the input/output port of the on-chip test unit of FIG. 1 according to an embodiment of the present invention.

FIGS. 3A and 3B illustrate the operation of the on-chip test unit of FIG. 1 in testing two IP cores contained in two SOC integrated circuits.

DETAILED DESCRIPTION OF PREFERRED EMBODIMENTS

Figure 1:
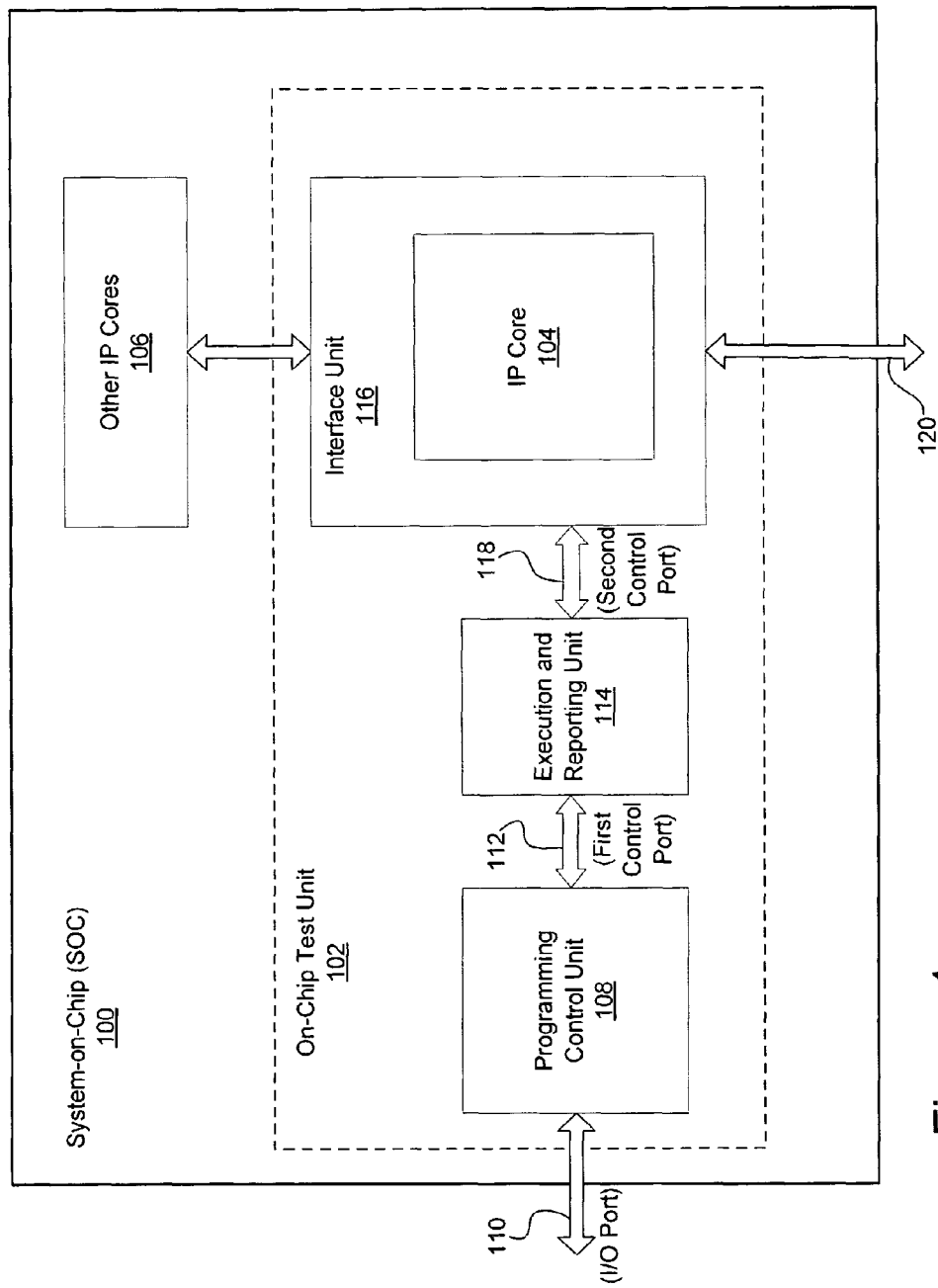
FIG. 1 is a functional block diagram of an SOC integrated circuit including an on-chip test unit according to one embodiment of the present invention.

FIG. 1 is a functional block diagram of an SOC integrated circuit 100 including an on-chip test unit 102 that tests an IP core 104 contained within the integrated circuit. By being contained within the SOC integrated circuit, the on-chip test unit 102 is able to comprehensively and more efficiently test the operation of the IP core 104 along with other IP cores 106 contained within the integrated circuit. This is true because being internal to the SOC integrated circuit 100, the on-chip test unit 102 can efficiently transfer all required signals to and from the IP core 104 being tested independent of the number of external pins (not shown) contained on the SOC integrated circuit. Furthermore, the on-chip test unit 102 is able to test the IP core 104 at the designed operating speed of that IP core. This improves the coverage and reliability of the testing since the IP core 104 is being tested at the speed at which the core will be operating during normal operation of the SOC integrated circuit 100. Moreover, because of the existence of the on-chip test unit 102, an expensive and complex external tester is no longer required and can be replaced with simpler and less expensive one.

In the following description, certain details are set forth in conjunction with the described embodiments of the present invention to provide a sufficient understanding of the invention. One skilled in the art will appreciate, however, that the invention may be practiced without these particular details. Furthermore, oneskilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

The on-chip test unit 102 includes a programming control unit 108 having an input/output (I/O) port 110 that receives an operation command from an external automated tester (not shown). In response to the operation command, the programming control unit 108 applies a plurality of command signals through a first control port 112 to an execution and reporting unit 114. The execution and reporting unit 114 operates in response to the command signals from the programming control unit 108 to generate a plurality of control signals, with the number and nature of the control signals generated being dependent upon the type of operation command received on the I/O port 110.

An interface unit 116 receives the control signals from the execution and reporting unit 114 through a second control port 118 and in response to these control signals the interface unit generates control signals to test the IP core 104. The type and nature of the control signals generated by the interface unit 116 depend upon the control signals applied by the execution and reporting unit 114, which are a function of the type of operation command applied on the I/O port 110. The command signals generated by the programming control unit 108 and the control signals from the execution and reporting unit 114 and interface unit 116 may include address, data, and control components. These signals will depend upon the type of IP core 104 being tested, as will be discussed in more detail below.

In response to the control signals from the interface unit 116, the IP core 104 performs the corresponding IF function accordingly and returns the result data to the interface unit, which then supplies the result data through the second control port 118 to the execution and reporting unit 114. The execution and reporting 5 unit 114 captures the result data at the time defined by the operation command and processes the result data to generate corresponding status data that indicates whether the IP core 104 passed or failed to test being conducted on the IP core. The status data is applied through the first control port 112 to the programming control unit 108 which, in turn, provides this status data in the form of a status data 10 packet through the I/O port 110 to the external tester (not shown). An external port 120 is shown coupled to the IF core 104 and corresponds to a port that is normally a part of the IP core, such as where the IF core corresponds to USB circuitry, and such functionality of the IP core may be tested where appropriate, as will be explained in more detail below.

The overall operation of the on-chip test unit 102 in testing the IP core 104 will now be described in more detail with reference to FIG. 1 and FIGS. 2A and 2B. FIG. 2A illustrates the format of an operation command applied to the I/O port of the on-chip test unit 102 and FIG. 2B illustrates the format of a status data packet output from the I/O port of the on-chip test unit. In operation, to commence testing of the IP core 104 the external tester (not shown) applies an operation command on the I/O port 110. One embodiment of the operation command is shown in FIG. 2A and includes four fields: 1) and operation code field OPC; 2) a design data field DDAT; 3) an expected time field ETIME; and 4) an expected data field EDAT. The operation code field OPC defines the type of test operation that the on-chip test unit 102 is to perform on the IP core 104, such as writing test data to or reading test data from the IP core, or starting the transmission of a packet from the IP core to port 118, or the start of the receipt of a packet at the IP core from the port 118, and so on. The design data field DDAT contains the test data to be written to or otherwise utilized in testing the IP core 104.

The third field in the operation command is the expected time field ETIME, which has a value indicating the time it is expected to take for the on-chip test unit 102 and IF core to complete executing the operation code OPC. In this way, the ETIME field indicates the time after the tester supplies the operation command on the I/O port 110 until the execution and reporting unit 114 can expect to capture the result data and also indicates approximately the time at which the tester can expect that the on-chip test unit 102 is providing test results on the I/O port corresponding to the operation command in the form of the status data packet. The last field of the operation command is the expected data field EDAT that contains expected data to be output from the IP core 104 in response to the applied data in the DDATA field. The execution and reporting unit 114 utilizes the EDATA field in generating the status data, as a will be described more detail below. Also note that every operation command need not include all four fields shown in FIG. 2A, with some commands possibly including fewer and some more fields.

The programming control unit 108 latches the operation command applied on the I/O port 110. The type of the I/O port 110 varies in different embodiments of the present invention, and in one embodiment is a synchronous port. In this embodiment, the I/O port 110 may include a single clock line or complementary clock lines that are utilized to clock data into and out of the programming control unit 108. A number of data lines in the I/O port 110 are utilized to transfer fields corresponding to the operation command to the programming control unit 108, with the fields or portions of each field being clocked into the programming control unit responsive to a clock signal on the clock line. The I/O port 110 further includes a read/write line indicating whether the current operation command is reading data from the IP core 104 or are writing data to the IP core. A valid line may also be part of the I/O port 110, with the tester (not shown) asserting a signal on this line to indicate that the signals on the data and a read/write lines are valid. The width of the I/O port 110 varies in different embodiments and in one embodiment includes only four lines, namely a single clock line, a single data line, a single read/write line, and a single valid line. As shown in FIG. 2A, the widths of the various fields in the operation command may vary, with the OPC field being N bits, the DDAT field being M bits, the ETIME field being P bits, and the EDAT field being Q bits in the example embodiment.

During operation of the on-chip test unit 102, the programming control unit 108, execution and reporting unit 114, and interface unit 116 operate in one of two modes: a test-input mode and a test-output mode. During the test-input mode, the programming control unit 108 latches the OPC, DDAT, ETIME, and EDAT fields corresponding to the operation command being applied by the external tester (not shown in FIG. 1). Once the programming control unit 108 has latched all four fields of the operation command applied on the I/O port 110, the control unit generates a plurality of command signals in response to the received operation command and applies these command signals through the first control port 112 to the execution and reporting unit 114. More specifically, the programming control unit 108 generates and applies appropriate command signals through the first control port 112 to initiate operation of the execution and reporting unit 114 and to supply the data contained in the OPC, DDATA, and EDATA fields to the execution and reporting unit 114, and in this sense the command signals may be considered as including this data.

In response to the data in the OPC field, the execution and reporting unit 114 executes a corresponding command to test the IP core 104 utilizing the data contained in the DDATA field. As part of this execution, the execution and reporting unit 114 applies a plurality of control signals through the second control port 118 to control the interface unit 116. These control signals include the data contained in the DDATA field when this data is to be written to the IP core 104. In response to the control signals from the execution and reporting unit 114, the interface unit 116 transfers data to or from the IP core 104 or otherwise controls the IF core as is required for execution of the command corresponding to the OPC field. For example, where the OPC field corresponds to a command to write test data into the IP core 104 the execution and reporting unit 114 and interface unit 116 operate in combination to transfer the test data contained in the DDAT field into the IP core. The execution and report unit 114 and interface unit 116 also operate together to determine proper signal connection between the IP core 104 and the rest of the SOC integrated circuit 100 during a normal operation mode and various test operation modes.

At this point, the programming control unit 108, execution and reporting unit 114, and interface unit 116 begin operation in the test-output mode. The test-output mode may be initiated by a separate operation command applied on the I/O port 110 by the external tester (not shown in FIG. 1), such as a read operation command being applied after test data has already been written to the IP core 104 through a previous write operation command. Alternatively, the units 108, 114, and 116 may operate in both the test-input mode and test-output mode responsive to the OPC field within a given operation command.

In the test-output mode, the execution and reporting unit 114 applies control signals through the second control port 118 to control the interface unit 116 to read core data from the IP core 104. For example, where test data corresponding to the data in the DDAT field was written to the IP core 104 during the test-input mode, the execution and reporting unit 114 now operates in combination with the interface unit 116 to read data from the same locations in the IP core to which the data was initially written. The interface unit 116 receives the core data from the IP core 104 and processes this core data to generate result data which, in turn, is applied through the second control port 118 to the execution and reporting unit 114.

In response to the result data from the interface unit 116, the execution and reporting unit 114 processes the result data to generate status data indicating the results of the test being performed on the IP core 104. Where the operation command includes the EDAT field, the execution and reporting unit 114 compares the result data from the interface unit 116 to the data contained in the EDAT field and determines whether the two sets of data match. If the two sets of data match the IP core 104 is operating properly, and if the two sets do not match the IP core 104 may not be operating properly. Based upon the results of this comparison, the execution and reporting unit 114 sets a pass/fail (P/F) flag to a value either indicating the IP core 104 has passed or failed to test.

Referring now to FIG. 2B, the execution and reporting unit 114 at this point supplies the P/F flag through the first control port to the programming control unit 108. The execution and reporting unit 114 also supplies logged data (LOGDAT) through the first control port 112 to the programming control unit 108, with the LOGDAT data corresponding to the result data received from the interface unit 116. At this point, the programming control unit 108 constructs the status data packet as shown in FIG. 2B in this embodiment of the present invention. The programming control unit 108 thus constructs the status data packet from the originally received OPC field along with the P/F flag and the LOGDAT data received from the execution and reporting unit 114, placing this received data in a P/F flag field and LOGDAT field, respectively.

Once the programming control unit 108 has constructed the status data packet, this packet is ready to be transferred to the external tester (not shown in FIG. 1) over the I/O port 110. Accordingly, the programming control unit 108 at this point places the status data packet on the I/O port 110 for capture by the external tester. The time between when the execution and reporting unit 114 captures the result data from the IP core 104 is approximately equal to the value of the ET1ME field, as previously mentioned. Furthermore, the time from when the execution and reporting unit 114 captures the result data until the program control unit 108 has constructed the corresponding status data packet is typically relatively short compared to the value of the ETIME field. Therefore, the value of the ETIME field also indicates approximately the time at which the tester can expect that the on-chip test unit 102 is providing the status data packet on the I/O port.

Referring now to FIG. 1, the on-chip test unit 102 has been described as testing the IP core 104. In another embodiment, the on-chip test unit 102 also tests at least some of the other IP cores 106 contained in the SOC integrated circuit 100. The interface unit 116 must of course be suitably constructed for interfacing to all the IP cores 106 two additionally be tested, and similar modifications to the programming control unit 108 and execution and reporting unit 114 may also be required, such as to support additional operation commands required for adequately testing these other IP cores.

FIGS. 3A and 3B illustrate the operation of the on-chip test unit 102 of FIG. 1 in testing two IP cores 302a, 302b contained in two SOC integrated circuits SOC1 and SOC2. This figure illustrates that the on-chip test unit 102 may be utilized to test a variety of different types of functionality of an IP core collectively when more SOCs are present. In the example of FIG. 3, the IP cores 302a and 302b may, for example, correspond to USB circuitry, In such a situation, the transmitting and receiving functionality of the USB IP cores 302a and 302b must be tested to properly test these IP cores. With a respective on-chip test circuit 102 contained within each of the integrated circuits SOC1, SOC2, the on-chip test units may be utilized to adequately test the IP cores 302a and 302b. Each of the test units 300a and 300b is same as or similar to the test unit 102 of FIG. 1, being dynamically configured differently to perform all desired tests on the IP cores 302a and 302b.

Figure 4:
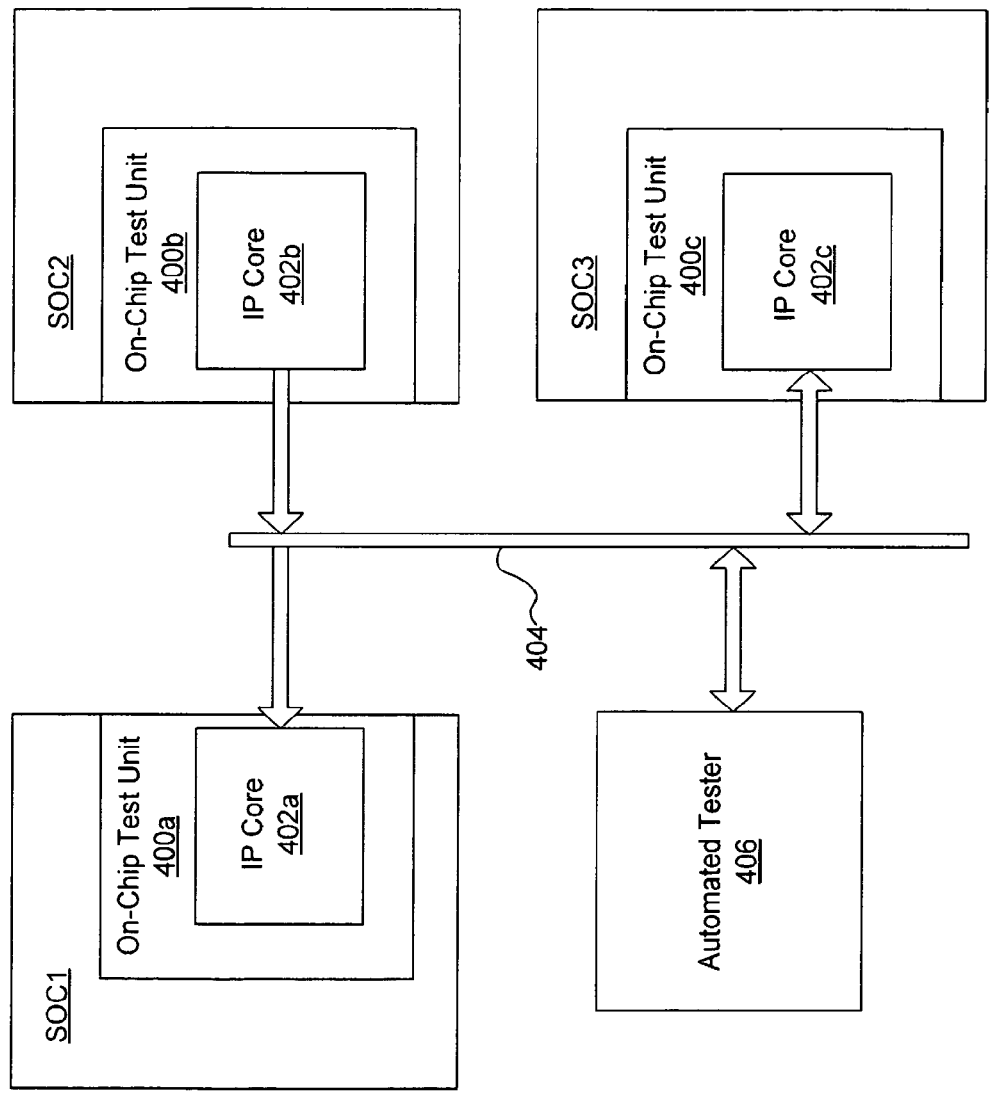
FIG. 4 illustrates the operation of the on-chip test unit of FIG. 1 in testing multiple IP cores contained in multiple SOC integrated circuits through a test bus interconnecting the integrated circuits.

FIG. 4 illustrates the operation of on-chip test units 400a, 400b, and 400c contained in SOC integrated circuits SOC1, SOC2, and SOC3, respectively. The SOC1, SOC2, and SOC3 can be different chips with different designs, or can be different instances of same design. The on-chip test units 400a-c may be utilized to test IP cores 402a-c contained in the SOC integrated circuits SOC1-SOC3. In the example of FIG. 4, the integrated circuits SOC1-SOC3 are interconnected through a test bus 404 and each of the IP cores 402a-c corresponds to an IP core that communicates over such a bus. Once again, as in the example of FIGS. 3A and 3B, the on-chip test units 400a-c contained within the integrated circuits SOC1-SOC3 can be utilized to adequately test the functionality of the IP cores 402a-c.

An automated tester 406 is coupled to the integrated circuits SOC1-SOC3 through the test bus 404 for communicating desired commands to each of the on-chip test units 400a-c and receiving status data packets from each of these units. The test bus 404 may in this embodiment be considered as including the I/O port 110 of FIG. 1, and it is through this portion of the test bus over which the automated tester 406 communicates with on-chip test units 400a-b. Each of the test units 400a-c is the same or similar to the test unit 102 of FIG. 1 which is required to perform all desired tests on the IP cores 402a-c.

The on-chip test unit 102 provides improved testability of complex mixed signal IP cores 104 embedded in an SOC integrated circuit 100. The on-chip test unit 102 provides a simple interface and requires only a small number of 10 pins in the I/O port 110 to enable an external tester to communicate with and test the integrated circuit 100. Moreover, the interface unit 116 component of the on-chip test unit 102 provides full access to IP cores 104 and the internal pins of the IP core, which enables at-speed testing in a real operation environment and in a broad number of operational modes. Furthermore, system level testing is possible where multiple SOC integrated circuits SOC1-SOC3 are involved, such as discussed with reference to FIGS. 3 and 4.

Even though various embodiments and advantages of the present invention have been set forth in the foregoing description, the above disclosure is illustrative only, and changes may be made in detail and yet remain within the broad principles of the present invention. Moreover, the functions performed by programming control unit 108, execution and reporting unit 114, and interface unit 116 can be combined to be performed by fewer elements, separated and performed by more elements, or combined into different functional blocks, as will be appreciated by those skilled in the art. Therefore, the present invention is to be limited only by the appended claims.

What is claimed is:

1. An on-chip test circuit for testing a system-on-chip integrated circuit, the on-chip test circuit comprising:
   a programming control unit having an input/output port adapted to receive an operation command, the programming control unit operable in a test-input mode to apply a plurality of command signals on a first control port in response to the operation command;
   an execution and reporting unit coupled to the programming control unit through the first control port, the execution and reporting unit operable responsive to the command signals to apply a plurality of control signals on a second control port during the test-input mode; and
   an interface unit coupled to the execution and reporting unit through a second control port and having an interface port adapted to be coupled to an intellectual property (IP) core, the interface unit operable responsive to the control signals to apply interface control signals on the interface port to control the IP core during the test-input mode;
   wherein the operation command comprises a command packet that includes:
      an operation code field that defines an operation to be performed by the on-chip test circuit;
      a data field containing data to be supplied to the IP core during the test-input mode;
      an expected time field containing an expected time to completion of the operation code; and
      an expected data field containing expected core data corresponding to the expected values of core data to be received from the IP core.

2. The on-chip test circuit of claim 1, wherein the command packet contains, in order, the operation code field, then the data field, then the expected data field, and finally the expected data field.

3. The on-chip test circuit of claim 1, wherein the execution and reporting unit captures the result data at approximately the expected time.

4. The on-chip test circuit of claim 3, wherein the programming control unit is operable to supply status data on the input/output port starting at approximately the expected time after the operation command is supplied to the unit.

5. The on-chip test circuit of claim 4, wherein the status data comprises a status data packet that includes:
   an operation code field indicating an operation code originally contained in the operation command supplied to the on-chip test circuit;
   a pass/fail flag field indicating whether the IP core passed a test corresponding to the applied operation command; and
   a log data field containing result data.

6. The on-chip test circuit of claim 5, wherein the data packet comprises, in order, the operation code field, followed by the pass/fail flag field, and then the log data field.

7. The on-chip test circuit of claim 6, wherein the pass/fail flag field contains a single binary bit.

8. The on-chip test circuit of claim 1, wherein the input/output port comprises:
   a clock line adapted to receive a clock signal to clock data and command portions of operation commands and status data into and out of the circuit;
   a single or plurality of data lines over which data portions of operation commands are transferred into the on-chip test circuit and over which status data is clocked out of the on-chip circuit;
   at least one command line over which command portions of operation commands are transferred into the circuit; and
   a valid line indicating whether data on the data and command lines is valid.

9. The on-chip test circuit of claim 1, wherein the interface unit further comprises a plurality of interface ports, each port being adapted to be coupled to a respective IP core.

10. A system-on-chip integrated circuit, comprising:
   a plurality of intellectual property (IP) cores;
   an on-chip test circuit for testing at least one of the IP cores, the on-chip test circuit including:
      a programming control unit having an input/output port adapted to receive an operation command, the programming control unit operable in a test-input mode to apply a plurality of command signals on a first control port in response to the operation command;
      an execution and reporting unit coupled to the programming control unit through the first control port, the execution and reporting unit operable responsive to the command signals to apply a plurality of control signals on a second control port during the test-input mode; and an interface unit coupled to the execution and reporting unit through a second control port and having an interface port adapted to be coupled to an IP core, the interface unit operable responsive to the control signals to apply interface control signals on the interface port to control the IP core during the test-input mode;

wherein the operation command comprises a command packet that includes:

an operation code field that defines an operation to be performed by the on-chip test circuit;

a data field containing data to be supplied to the IP core during the test-input mode;

an expected time field containing an expected time to completion of the operation code; and an expected data field containing expected core data corresponding to the expected values of core data to be received from the IP core.

11. The system-on-chip integrated circuit of claim 10, wherein one IP core comprises a processor and one IP core comprises a memory.

12. The system-on-chip integrated circuit of claim 10, further comprising an automated tester coupled to the input/output port of the integrated circuit.

13. The system-on-chip integrated circuit of claim 12, further comprising a plurality of system-on-chip integrated circuits, the automated tester being coupled to the respective input/output ports of the integrated circuits through a test bus.

14. A method of testing intellectual property (IP) cores contained in a system-on-chip integrated circuit (SOC IC), the method comprising:

receiving, during a test-input mode, an operation command on the input/output port;

applying, during the test-input mode, a plurality of command signals on a first control port of the SOC IC in response to receiving the operation command;

applying, during the test-input mode, a plurality of control signals on a second control port of the SOC IC in response to applying the command signals;

processing, during the test-input mode, the received control signals to supply test data to each of the IP cores being tested;

receiving, during a test-output mode, result data in response to the supplied test data from each of the IP cores being tested;

processing the result data during the test-output mode;

generating, during the test-output mode, from the processed result data, a status data packet, the status data packet including an operation code component and a status flag component; and receiving, during the test-output mode, the status data packet through the first control port; and providing, during the test-output mode, the status data packet on the input/output port;

wherein an operation code component of the operation command defines the operation to be performed by the on-chip test circuit;

wherein a data component of the operation command contains data to be supplied to the IP core during the test-input mode;

wherein an expected time component of the operation command contains an expected time of completion of the operation code; and wherein an expected data component of the operation command contains expected core data corresponding to the expected values of core data to be received from the IP core.

15. The method of claim 14, wherein the status data packet further comprises a logged data component having a value that is equal to a value of the expected data component when the status flag component has a pass value.

16. The method of claim 15, wherein the command packet contains, in order, the operation code component followed by an input data component, the expected time component, and finally the expected data component.

17. The method of claim 16, wherein the status data packet contains, in order, the operation code component followed by the status flag component and then the logged data component.

18. The method of claim 17, wherein the status data packet is provided on the input/output port at approximately the value of the expected time component after the operation command is initially received on the input/output port.

* * * * *